(12) United States Patent
Goda

(10) Patent No.: US 8,951,865 B2
(45) Date of Patent: Feb. 10, 2015

(54) MEMORY ARRAYS WHERE A DISTANCE BETWEEN ADJACENT MEMORY CELLS AT ONE END OF A SUBSTANTIALLY VERTICAL PORTION IS GREATER THAN A DISTANCE BETWEEN ADJACENT MEMORY CELLS AT AN OPPOSING END OF THE SUBSTANTIALLY VERTICAL PORTION AND FORMATION THEREOF

(71) Applicant: Micron Technology, Inc., Boise, ID (US)

(72) Inventor: Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 179 days.

(21) Appl. No.: 13/746,578

(22) Filed: Jan. 22, 2013

(65) Prior Publication Data
US 2013/0137229 A1 May 30, 2013

Related U.S. Application Data

(62) Division of application No. 12/903,264, filed on Oct. 13, 2010, now Pat. No. 8,378,412.

(51) Int. Cl.
| | | |
|---|---|---|
| *H01L 21/336* | (2006.01) | |
| *H01L 29/66* | (2006.01) | |
| *H01L 27/115* | (2006.01) | |
| *H01L 29/788* | (2006.01) | |
| *H01L 29/792* | (2006.01) | |

(52) U.S. Cl.
CPC .... *H01L 29/66666* (2013.01); *H01L 27/11556* (2013.01); *H01L 27/11582* (2013.01); *H01L 29/7889* (2013.01); *H01L 29/7926* (2013.01)
USPC ............................. 438/268; 257/326; 257/314

(58) Field of Classification Search
CPC ................... H01L 27/11556; H01L 27/11582; H01L 29/66666; H01L 29/7926; H01L 29/7889
USPC .......................... 438/268; 257/314–326, 328, 257/E29.3–E29.309, E21.19
See application file for complete search history.

(56) References Cited

U.S. PATENT DOCUMENTS

| | | |
|---|---|---|
| 2008/0173928 A1 | 7/2008 | Arai et al. |
| 2009/0294828 A1 | 12/2009 | Ozawa et al. |
| 2009/0310425 A1 | 12/2009 | Sim et al. |
| 2010/0078701 A1 | 4/2010 | Shim et al. |
| 2010/0097858 A1 | 4/2010 | Tokiwa et al. |
| 2010/0140685 A1 | 6/2010 | Kang et al. |
| 2011/0073866 A1 | 3/2011 | Kim et al. |

OTHER PUBLICATIONS

R. Katsumata et al. "Pipe-Shaped BiCS Flash Meory With 16 Stacked Layers and Multi-Level-Cell Operation for Ultra High Density Storage Devices", 2009 Symposium on VLSI Technology Digest of Technical Papers, pp. 136-137.

*Primary Examiner* — Shaun Campbell
(74) *Attorney, Agent, or Firm* — Dicke, Billig & Czaja, PLLC

(57) ABSTRACT

Memory arrays and their formation are disclosed. One such memory array has a string of series-coupled memory cells with a substantially vertical portion. A distance between adjacent memory cells at one end of the substantially vertical portion is greater than a distance between adjacent memory cells at an opposing end of the substantially vertical portion. For other embodiments, thicknesses of respective control gates of the memory cells and/or thicknesses of the dielectrics between successively adjacent control gates may increase as the distances of the respective control gates/dielectrics from the opposing end of the substantially vertical portion increase.

21 Claims, 8 Drawing Sheets

MEMORY ARRAYS WHERE A DISTANCE BETWEEN ADJACENT MEMORY CELLS AT ONE END OF A SUBSTANTIALLY VERTICAL PORTION IS GREATER THAN A DISTANCE BETWEEN ADJACENT MEMORY CELLS AT AN OPPOSING END OF THE SUBSTANTIALLY VERTICAL PORTION AND FORMATION THEREOF

RELATED APPLICATION

This application is a divisional of U.S. application Ser. No. 12/903,264, titled "MEMORY ARRAYS WHERE A DISTANCE BETWEEN ADJACENT MEMORY CELLS AT ONE END OF A SUBSTANTIALLY VERTICAL PORTION IS GREATER THAN A DISTANCE BETWEEN ADJACENT MEMORY CELLS AT AN OPPOSING END OF THE SUBSTANTIALLY VERTICAL PORTION AND FORMATION THEREOF," filed Oct. 13, 2010 (allowed), which application is commonly assigned and incorporated in its entirety herein by reference.

FIELD

The present disclosure relates generally to memories and in particular, in one or more embodiments, the present disclosure relates to memory arrays where a distance between adjacent memory cells at one end of a substantially vertical portion is greater than a distance between adjacent memory cells at an opposing end of the substantially vertical portion and the formation thereof.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing spacing between memory cells and/or making memory cells smaller. Smaller dimensions of some device elements may cause operational problems with the cell. For example, the channel between the source/drain regions becomes shorter, possibly causing severe short channel effects.

One way of increasing the density of memory devices is to form stacked memory arrays, e.g., often referred to as three-dimensional memory arrays. For example, one type of three-dimensional memory array may include pillars of stacked memory elements, such as substantially vertical NAND strings.

FIG. 1A presents an example of a portion of a memory array 100 of the prior art that includes substantially vertical strings of memory cells 110 located adjacent to substantially vertical semiconductor pillars 120 that may act as channel regions for the strings of memory cells located thereon. That is, during operation of one or more memory cells 110 of a string, a channel can be formed in the corresponding semiconductor pillar 120.

FIGS. 1B and 1C respectively show cross-sections of memory cells $110_T$ and $110_B$ located at different levels (e.g., vertical levels) within memory array 100. For example, memory cell $110_T$ is located at a vertical level (e.g., near the top of memory array 100) that is above a vertical level (e.g., near the bottom of memory array 100) at which memory cell $110_B$ is located.

Semiconductor pillars 120 may be tapered in a direction from top to bottom, causing the radius of semiconductor pillars 120 to be smaller at memory cell $110_B$ near the bottom of memory array 100 than at memory cell $110_T$ near the top of memory array 100, as shown in FIGS. 1A-1C. Charge-storage structures 130 are located adjacent to semiconductor pillars 120 and may also be tapered in a direction from top to bottom. The radius of charge-storage structure 130 may be smaller at memory cell $110_B$ than at memory cell $110_T$. Memory cells 110 may include a control gate 140 (e.g., as a portion of or coupled to an access line, such as a word line) located adjacent to a respective charge-storage structure 130.

Semiconductor pillars 120 and charge-storage structures 130 are sometimes formed in openings formed though a material, such as alternating dielectrics and conductors, e.g., that form the control gates 140, and therefore take on the overall shape of the openings. In some instances, the process, e.g., etching, that forms these openings results in openings that taper in a direction from top to bottom, thereby causing a semiconductor pillar 120 and a charge-storage structure 130 formed therein to be tapered as shown.

The difference in the radius of the pillar 120 at memory cells $110_T$ and $110_B$ and/or the difference in the radius of the charge-storage structure 130 at memory cells $110_T$ and $110_B$ can cause differences in the programming properties of memory cells $110_T$ and $110_B$. This means that the programming properties of the memory cells may vary over the height of the string of memory cells. For example, the larger radius of the pillar 120 at memory cell $110_T$ and/or the larger radius of the charge-storage structure 130 at memory cell $110_T$ may cause memory cell $110_T$ to program more slowly than memory cell $110_B$. This is due in part to the reduced gate coupling ratio associated with the larger radius of the pillar 120 at memory cell $110_T$ and/or the larger radius of the charge-storage structure 130 at memory cell $110_T$, where the gate coupling ratio may be defined as the ratio of the voltage imparted to the charge-storage structure 130 during programming to the voltage applied to control gate 140 during programming.

In addition, the cell-to-cell interference between adjacent memory cells, due to the capacitive coupling (e.g., termed parasitic capacitance) between the adjacent memory cells, may be larger at memory cell $110_T$ than at memory cell $110_B$, e.g., owing to the larger radius of the pillar 120 at memory cell $110_T$ and/or the larger radius of the charge-storage structure 130 at memory cell $110_T$. The cell-to-cell interference may also act to reduce the gate coupling ratio.

For the reasons stated above, and for other reasons stated below which will become apparent to those skilled in the art upon reading and understanding the present specification, there is a need in the art for alternatives to existing memory arrays with pillars of stacked memory elements.

DETAILED DESCRIPTION

Figures 1A, 1B, 1C:
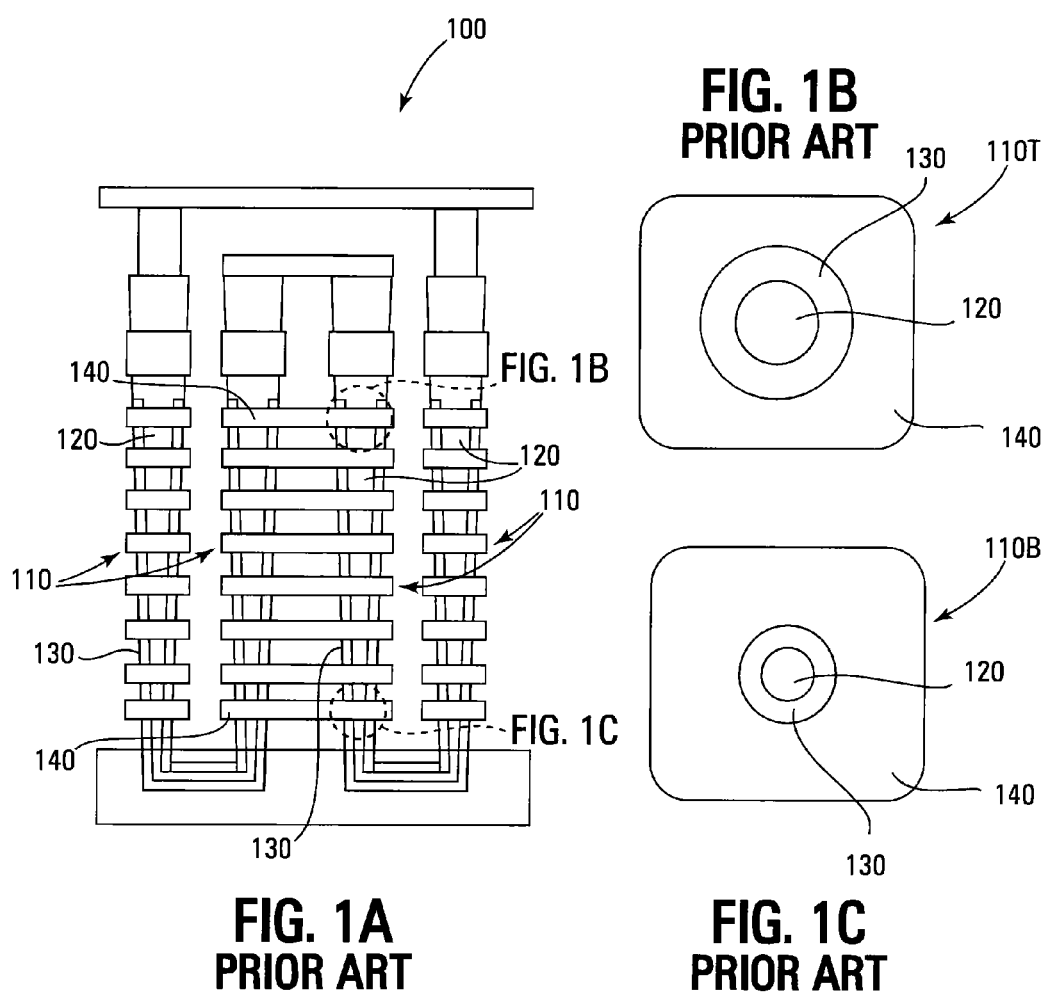
FIG. 1A presents an example of a memory array of the prior art.
FIGS. 1B and 1C respectively show cross-sections of memory cells located at different levels within the memory array of FIG. 1A.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

Figure 2:
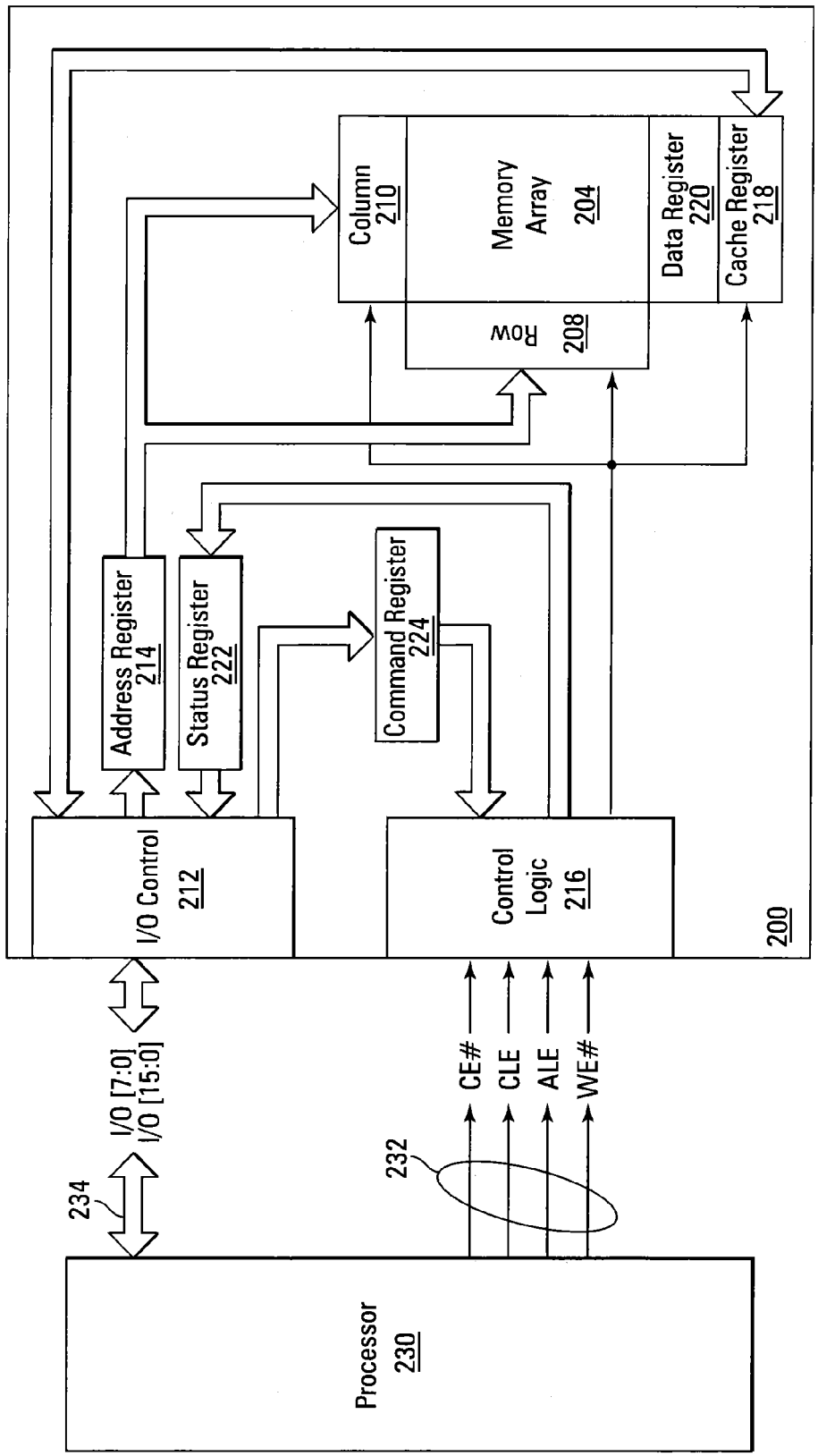
FIG. 2 is a simplified block diagram of a memory system, according to an embodiment.

FIG. 2 is a simplified block diagram of a NAND flash memory device 200 in communication with a processor 230 as part of an electronic system, according to an embodiment. The processor 230 may be a memory controller or other external host device. Memory device 200 includes an array of memory cells 204 formed in accordance with embodiments of the disclosure. A row decoder 208 and a column decoder 210 are provided to decode address signals. Address signals are received and decoded to access memory array 204.

For some embodiments, memory array 204 may include substantially vertical strings of series-coupled memory cells, where a distance between adjacent memory cells at one end of a substantially vertical string is greater than a distance between adjacent cells at an opposing end of the substantially vertical string. For example, in one or more such embodiments, a distance between successively adjacent memory cells of a substantially vertical string increases as a distance of the successively adjacent memory cells from the opposing end, e.g., a bottom, of the substantially vertical sting increases. In at least some embodiments, thicknesses of respective control gates of the memory cells of a substantially vertical string may also increase as the distances of the respective control gates from the opposing end, e.g., the bottom, of the substantially vertical string increase. In at least some other embodiments, a distance between successively adjacent memory cells of the substantially vertical string increases as a step function of a distance of the successively adjacent memory cells from the opposing end of the substantially vertical string.

Memory device 200 also includes input/output (I/O) control circuitry 212 to manage input of commands, addresses and data to the memory device 200 as well as output of data and status information from the memory device 200. An address register 214 is in communication with I/O control circuitry 212, and row decoder 208 and column decoder 210 to latch the address signals prior to decoding. A command register 224 is in communication with I/O control circuitry 212 and control logic 216 to latch incoming commands. Control logic 216 controls access to the memory array 204 in response to the commands and generates status information for the external processor 230. The control logic 216 is in communication with row decoder 208 and column decoder 210 to control the row decoder 208 and column decoder 210 in response to the addresses.

Control logic 216 is also in communication with a cache register 218. Cache register 218 latches data, either incoming or outgoing, as directed by control logic 216 to temporarily store data while the memory array 104 is busy writing or reading, respectively, other data. During a write operation, data is passed from the cache register 218 to data register 220 for transfer to the memory array 204; then new data is latched in the cache register 218 from the I/O control circuitry 212. During a read operation, data is passed from the cache register 218 to the I/O control circuitry 212 for output to the external processor 230; then new data is passed from the data register 220 to the cache register 218. A status register 222 is in communication with I/O control circuitry 212 and control logic 216 to latch the status information for output to the processor 230.

Memory device 200 receives control signals at control logic 216 from processor 230 over a control link 232. The control signals may include at least a chip enable CE#, a command latch enable CLE, an address latch enable ALE, and a write enable WE#. Memory device 200 receives command signals (which represent commands), address signals (which represent addresses), and data signals (which represent data) from processor 230 over a multiplexed input/output (I/O) bus 234 and outputs data to processor 230 over I/O bus 234.

For example, the commands are received over input/output (I/O) pins [7:0] of I/O bus 234 at I/O control circuitry 212 and are written into command register 224. The addresses are received over input/output (I/O) pins [7:0] of bus 134 at I/O control circuitry 212 and are written into address register 214. The data are received over input/output (I/O) pins [7:0] for an 8-bit device or input/output (I/O) pins [15:0] for a 16-bit device at I/O control circuitry 212 and are written into cache register 218. The data are subsequently written into data register 220 for programming memory array 204. For another embodiment, cache register 218 may be omitted, and the data are written directly into data register 220. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins may be used in the various embodiments.

FIGS. 3A-3E are cross-sectional views of a portion of a memory array 300 during various stages of fabrication. Memory array 300 may form a portion of memory array 204 of FIG. 2 for some embodiments.

Figure 3A:
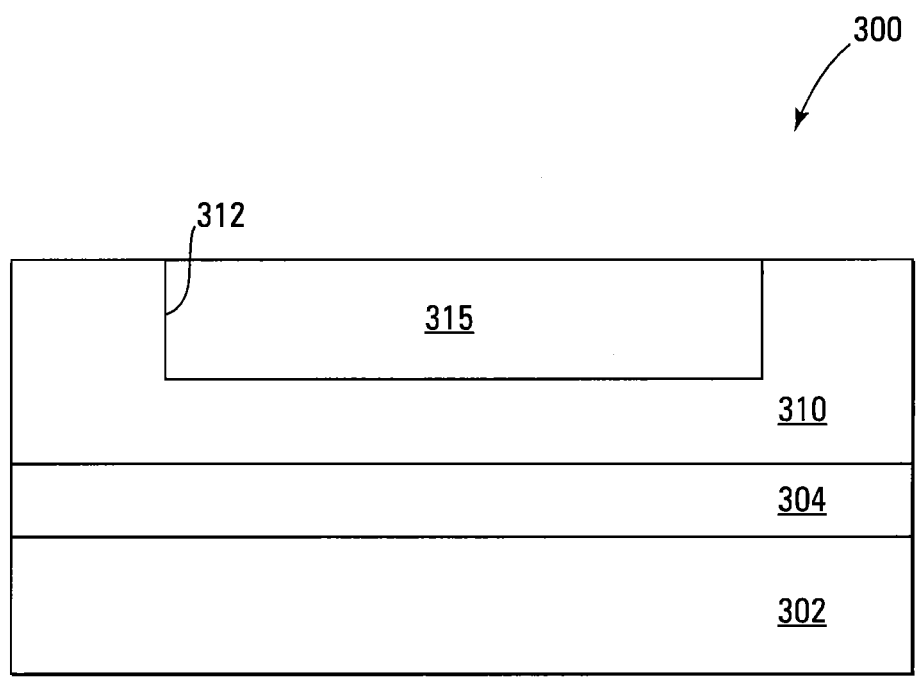
FIGS. 3A-3E are cross-sectional views of a portion of a memory array during various stages of fabrication, according to another embodiment.

The formation of the structure of FIG. 3A may include forming a dielectric 304 over a semiconductor 302 that, in some embodiments, may be comprised of silicon, e.g., monocrystalline silicon, that may be conductively doped, e.g., to have a p-type or n-type conductivity. Dielectric 304 is generally formed of one or more dielectric materials. For example, dielectric 302 may be formed from an oxide, e.g., silicon oxide, an oxynitride, e.g., silicon oxynitride, etc.

A conductor 310 may then be formed over dielectric 304. Conductor 310 is generally formed of one or more conductive materials, such as a conductively doped polysilicon. Conductor 310 may then be patterned to form an opening 312 therein. For example, a mask (not shown), e.g., imaging resist, such as photo-resist, may be formed over conductor 310 and patterned to define a region of conductor 310 for removal. The region defined for removal may be subsequently removed, e.g., by etching, to form opening 312 that terminates within conductor 310. In some embodiments, opening 312 may be a slot extending substantially perpendicular to the face plane of FIG. 3A.

Sacrificial material 315, such as oxide, nitride, etc., may then be formed within opening 312. For example, the sacrificial material 315 may overfill opening 312 and extend over the upper surface of conductor 310, e.g., adjacent to opening 312. Sacrificial material 315 may then be removed from the upper surface of conductor 310, e.g., by chemical mechanical planarization (CMP) so the upper surface of sacrificial material 315 is substantially flush with the upper surface of conductor 310. In general, sacrificial material 315 may be chosen to protect underlying layers while allowing the subsequent selective removal of sacrificial material 315.

A dielectric 318 may then be formed over conductor 310 and sacrificial material 315. Dielectric 318 is generally formed of one or more dielectric materials. For example, dielectric 318 may be formed from an oxide, e.g., silicon oxide, an oxynitride, e.g., silicon oxynitride, etc.

Alternating dielectrics 320 and conductors 330 are then formed over dielectric 318. Dielectrics 320 are generally formed of one or more dielectric materials. Conductors 330 are generally formed of one or more conductive materials. For example, dielectrics 320 may be formed from an oxide, e.g., silicon oxide, an oxynitride, e.g., silicon oxynitride, etc. Conductors 320 may be formed from conductively doped polysilicon for some embodiments.

The thicknesses of the respective dielectrics 320 may increase as the distances (e.g., vertical distances) of the respective dielectrics 320 from (e.g., height of the respective dielectrics 320 above) the upper surface of dielectric 318 increases, either gradually or as a step function. For example, where the thickness increases gradually, the greater the height of an individual dielectric 320 above the upper surface of dielectric 318, the greater the thickness of that individual dielectric 320. In another example, where the thickness increases as a step function, the thickness increases as a step function of the height of an individual dielectric 320 above the upper surface of dielectric 318.

The thicknesses of the respective conductors 330 may also increase as the distances (e.g., vertical distances) of the respective conductors 330 from (e.g., height of the respective conductors 330 above) the upper surface of dielectric 318 increases. Again, in embodiments where the thickness increases gradually, the greater the height of an individual conductor 330 above the upper surface of conductor 310 the greater the thickness of that individual conductor 330. In other embodiments, the thickness of the respective conductors 330 may increase as a step function of the distances of the respective conductors 330 from the upper surface of dielectric 318.

Figure 3B:
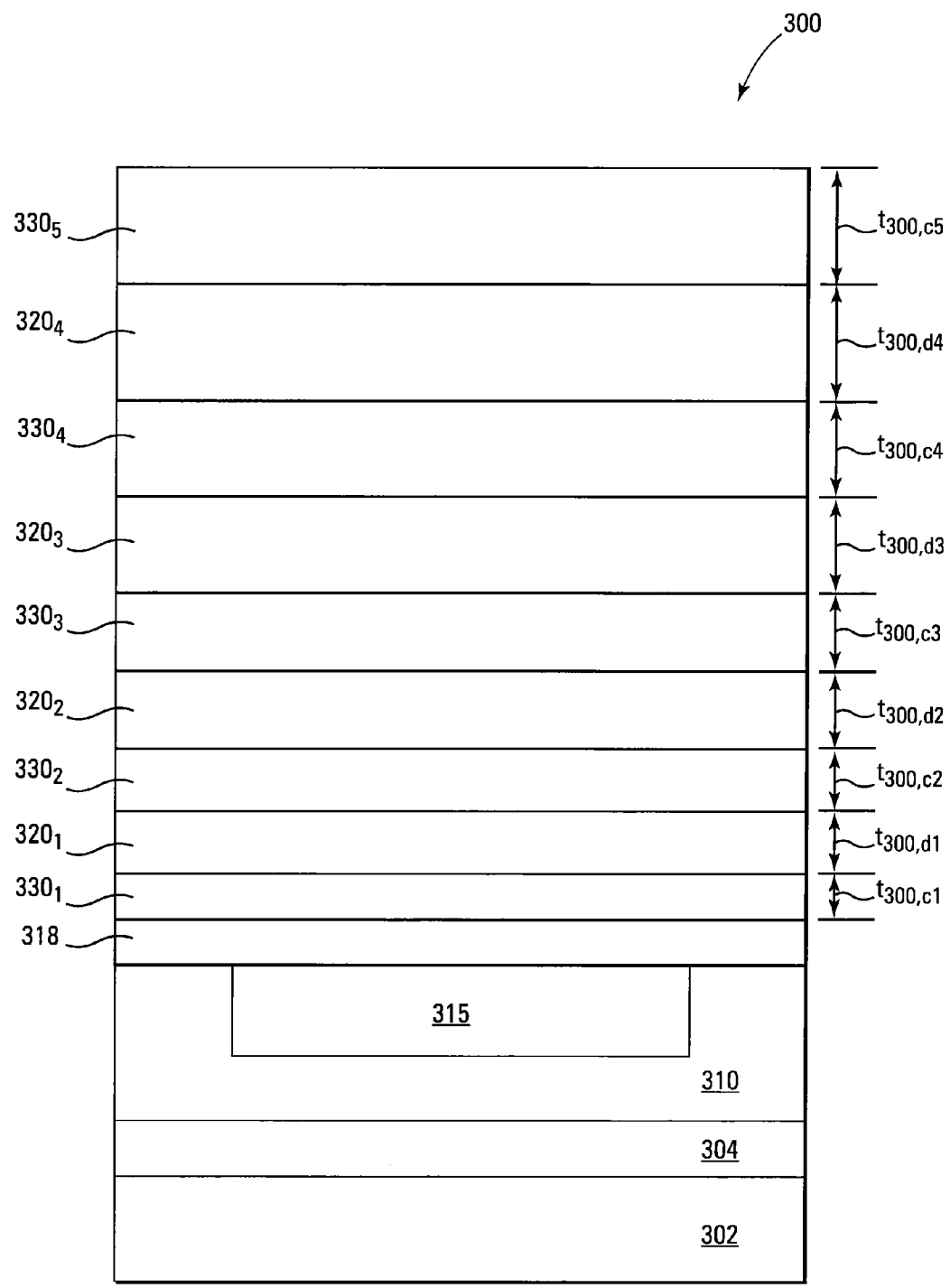

In the example of FIG. 3B, conductor $330_1$ having a thickness $t_{300,c1}$ is formed over dielectric 318; dielectric $320_1$ having a thickness $t_{300,d1}$ is formed over conductor $330_1$; conductor $330_2$ having a thickness $t_{300,c2}$ is formed over dielectric $320_1$; dielectric $320_2$ having a thickness $t_{300,d2}$ is formed over conductor $330_2$; conductor $330_3$ having a thickness $t_{300,c3}$ is formed over dielectric $320_2$; dielectric $320_3$ having a thickness $t_{300,d3}$ is formed over conductor $330_3$; conductor $330_4$ having a thickness $t_{300,c4}$ is formed over dielectric $320_3$; dielectric $320_4$ having a thickness $t_{300,d4}$ is formed over conductor $330_4$; and conductor $330_5$ having a thickness $t_{300,c5}$ is formed over dielectric $320_4$.

The thickness $t_{300,d4}$ of dielectric $320_4$ is greater than thickness $t_{300,d3}$ of dielectric $320_3$. The thickness $t_{300,d3}$ of dielectric $320_3$ is greater than thickness $t_{300,d2}$ of dielectric $320_2$. The thickness $t_{300,d2}$ of dielectric $320_2$ is greater than thickness $t_{300,d2}$ of dielectric $320_1$. The thickness of dielectric 318 may greater than, less than, or equal to thickness $t_{300,d1}$ of dielectric $320_1$.

The thickness $t_{300,c5}$ of conductor $330_5$ is greater than thickness $t_{300,c4}$ of conductor $330_4$. The thickness $t_{300,c4}$ of conductor $330_4$ is greater than thickness $t_{300,c3}$ of conductor $330_3$. The thickness $t_{300,c3}$ of conductor $330_3$ is greater than thickness $t_{300,c2}$ of conductor $330_2$. The thickness $t_{300,c2}$ of conductor $330_2$ is greater than thickness $t_{300,c1}$ of conductor $330_1$.

Figure 3C:
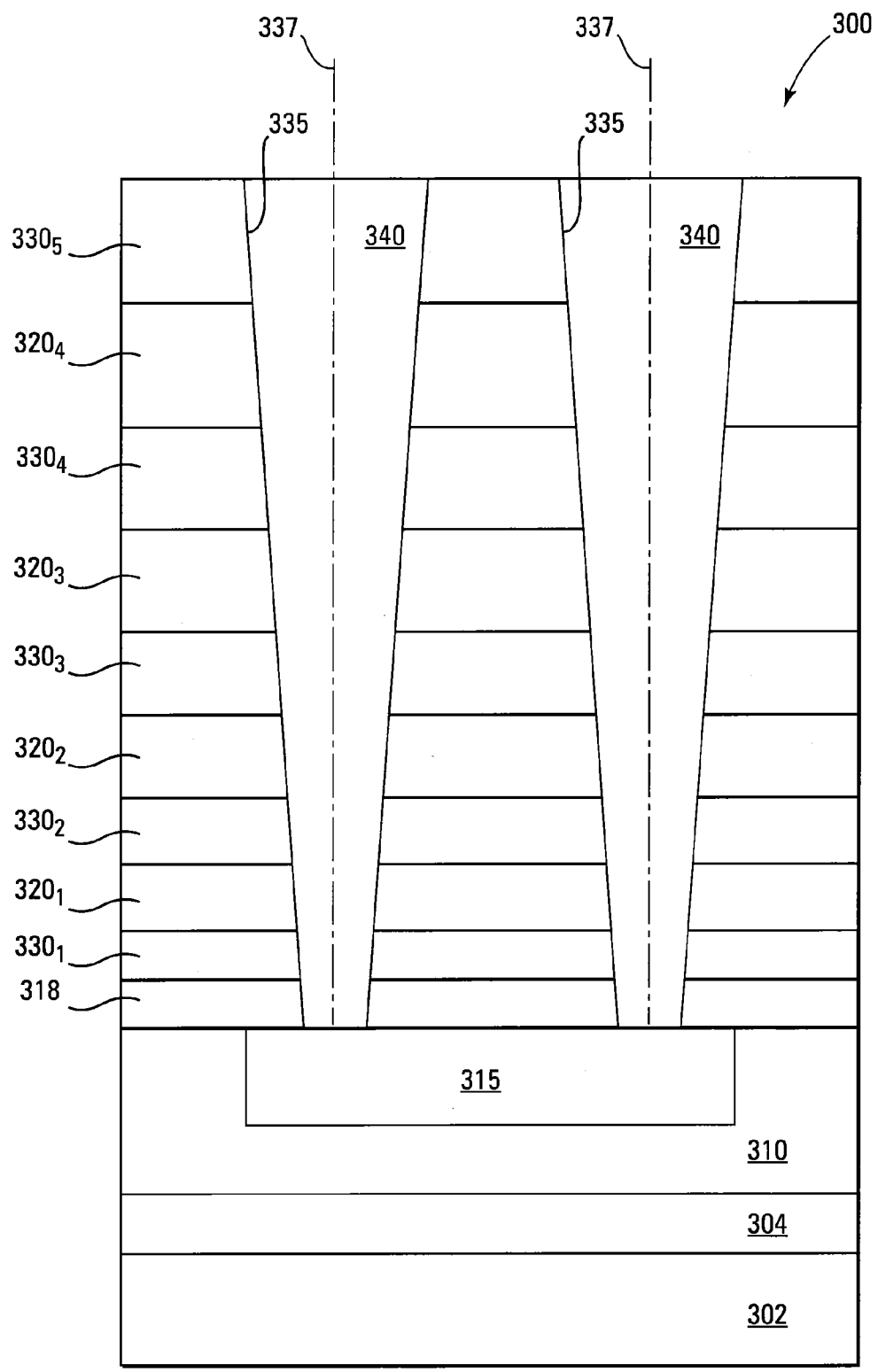

Conductor $330_5$ may then be patterned for forming openings 335 through conductors $330_5$-$330_1$, dielectrics $320_4$-$320_1$, and dielectric 318, stopping on or within sacrificial material 315, as shown in FIG. 3C. For example, a mask (not shown), e.g., of photoresist, may be formed over conductor $330_5$ and patterned for exposing portions conductors $330_5$-$330_1$, dielectrics $320_4$-$320_1$, and dielectric 318. The exposed portions of conductors $330_5$-$330_1$, dielectrics $320_4$-$320_1$, and dielectric 318 are then removed, such as by etching, thereby forming openings 335 that leave ends of conductors $330_5$-$330_1$, dielectrics $320_4$-$320_1$, and dielectric 318 exposed.

Openings 335 may be substantially vertical. For example, openings 335 may respectively have substantially vertical central axes (e.g., axes of revolution) 337. Openings 335 may be tapered (e.g., may converge) in a direction from top to bottom. As used herein, top and bottom refer to relative placements and do not require any particular absolute orientation. In relation to the figures, the bottom of an element will refer to a portion of that element generally closest to semiconductor 302 while the top of that element will refer to a portion of that element generally furthest away from semiconductor 302.

In one or more embodiments, a sacrificial material 340, e.g., that may follow the same material guidelines as sacrificial material 315, may then be formed within openings 335, as shown in FIG. 3C. Sacrificial materials 315 and 340 may then be removed, e.g., by etching, in FIG. 3D, to form an opening 348. For example, sacrificial materials 315 and 340 may be removed substantially concurrently (e.g., concurrently). In other embodiments, no sacrificial material 340 is formed within openings 335.

Removing material 340 from openings 335 substantially reopens (e.g., substantially reforms) openings 335. As such, opening 348 may be thought of as including substantially reopened openings 335 as substantially vertical portions thereof and a substantially horizontal portion in conductor 310 connected to substantially reopened openings 335.

A charge-storage structure 350, such as one comprising a stack of a tunnel dielectric layer, a charge storage layer, and a blocking dielectric, may then be formed in opening 348 adjacent to conductor 310, conductors $330_1$-$330_5$, dielectrics $320_1$-$320_4$, and dielectric 318 so as to line opening 348. For example, charge storage structure 350 may be formed by a conformal deposition process, such as chemical vapor deposition (CVD), atomic layer deposition (ALD), etc.

Charge storage structure 350 is generally formed of one or more materials capable of storing a charge. For some embodiments, charge storage structure 350 may include a tunnel dielectric, such as a tunnel oxide, formed adjacent to conductor 310, conductors $330_1$-$330_5$, dielectrics $320_1$-$320_4$, and dielectric 318, charge storage material, such as a nitride, formed adjacent to (e.g., on) the tunnel dielectric, and a blocking dielectric, such as a blocking oxide, formed adjacent to (e.g., on) the charge storage material. For other embodiments, charge storage structure 350 may be a dielectric, e.g., a high-dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$. Other charge-storage structures are also known.

A semiconductor structure 355, e.g., polysilicon, may be formed within the remainder of opening 348 adjacent to charge storage structure 350. For example, semiconductor structure 355 may substantially fill the remainder of opening 348. Semiconductor structure 355 may be planarized, e.g., using CMP, so that upper surfaces thereof are substantially flush (e.g. flush) with the upper surface of conductor $330_5$. For some embodiments, semiconductor structure 355 may be a continuous structure.

Portions (e.g., substantially vertical portions) of semiconductor structure 355 may form substantially vertical pillars $360_1$ and $360_2$, e.g., semiconductor pillars, that may be connected together at their bottoms by the portion (e.g., the substantially horizontal portion) of semiconductor structure 355 within conductor 310. For example, pillars $360_1$ and $360_2$ may respectively have substantially vertical central axes (e.g., axes of revolution) $362_1$ and $362_2$. Pillars $360_1$ and $360_2$ and the substantially horizontal portion of semiconductor structure 355 may be contiguous, as shown in FIG. 3D.

Pillars $360_1$ and $360_2$ may be tapered in a direction from top to bottom. That is, the cross-sectional areas of pillars $362_1$ and $362_2$ respectively substantially perpendicular to the axes $362_1$ and $362_2$ may decrease in a direction from the top of pillars $362_1$ and $362_2$ to bottom of pillars $362_1$ and $362_2$.

For some embodiments, charge storage structure 350 may be thought of as including substantially vertical first and second portions respectively adjacent to pillars $360_1$ and $360_2$ that are connected to a third portion of charge storage structure 350 adjacent to the portion (e.g., the substantially horizontal portion) of semiconductor structure 355 within conductor 310. The central axes (e.g., the axes of revolution) of the substantially vertical first and second portions of charge storage structure 350 respectively adjacent to pillars $360_1$ and $360_2$ are the substantially vertical axes $361_1$ and $361_2$. For other embodiments, the substantially vertical first and second portions and the third portion of charge storage structure 350 may be contiguous. The substantially vertical first and second portions of charge storage structure 350 respectively adjacent to pillars $360_1$ and $360_2$ may also be tapered in a direction from top to bottom.

Figure 3D:
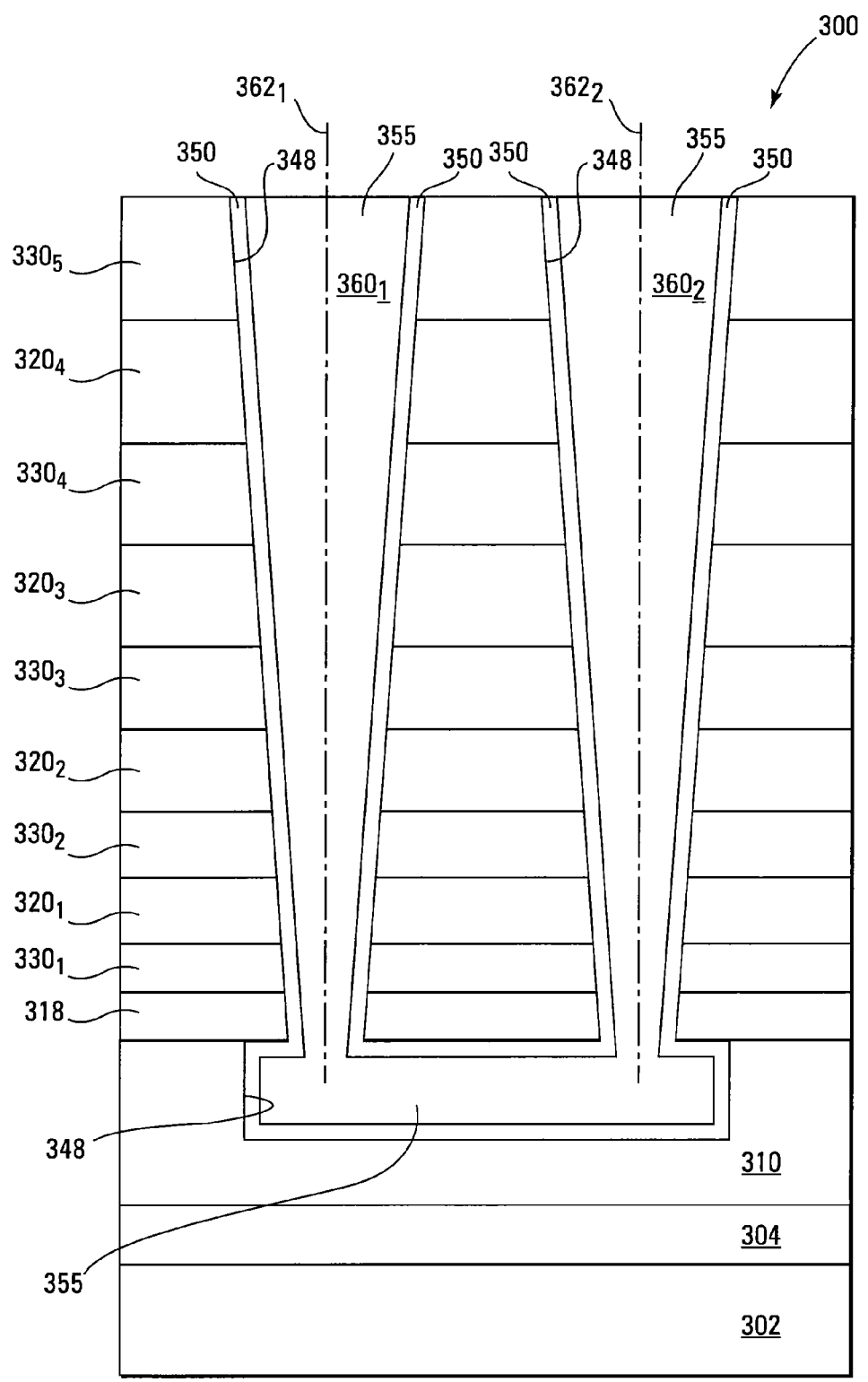
Figure 3E:
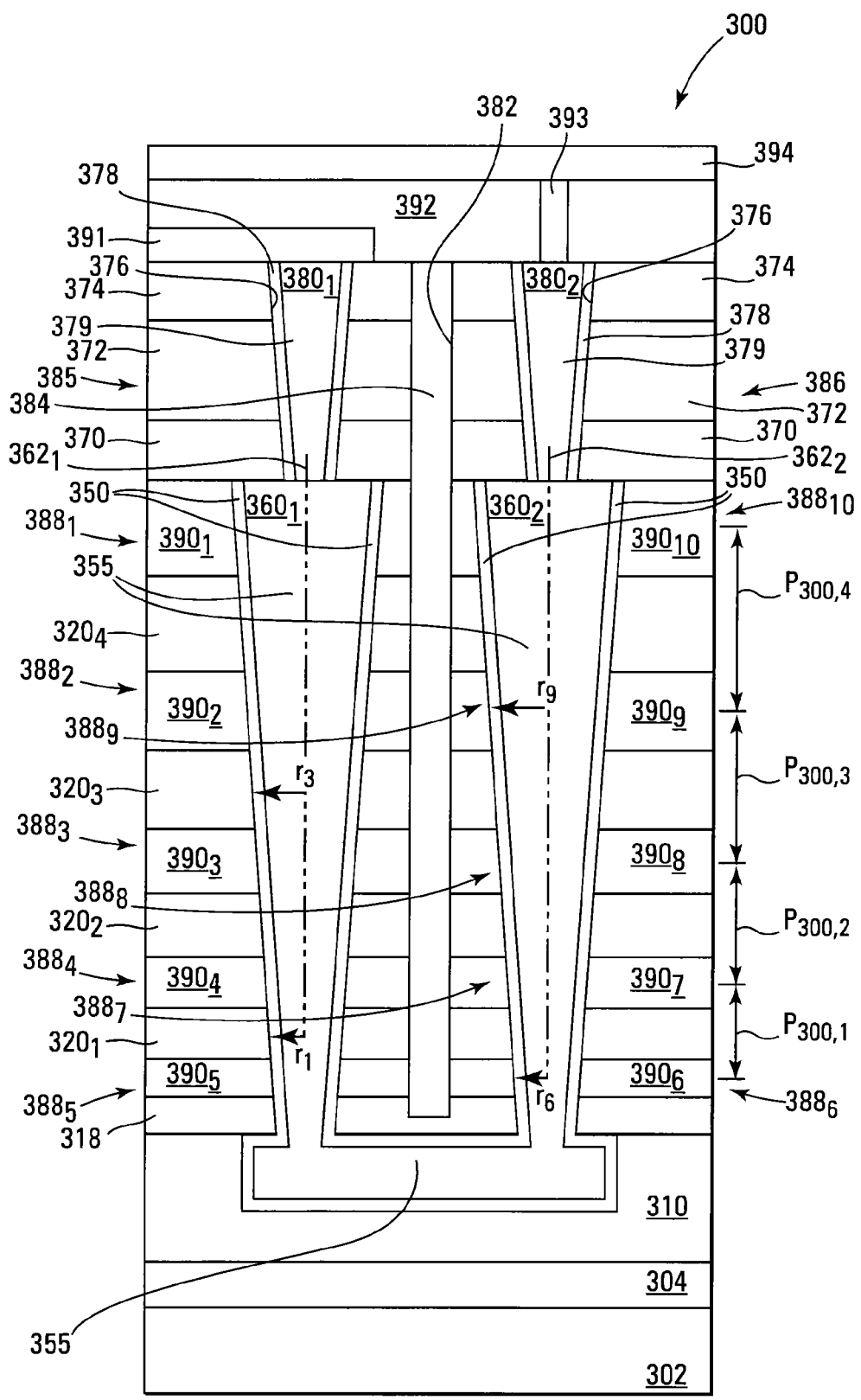

A dielectric 370 may be formed over the structure of FIG. 3D in FIG. 3E. Dielectric 370 is generally formed of one or more dielectric materials. For example, dielectric 370 may be formed from an oxide, e.g., silicon oxide, an oxynitride, e.g., silicon oxynitride, etc.

Dielectric 370 may be formed over conductor $330_5$, the ends of charge storage structure 350, and pillars 360. A conductor 372 may then be formed over dielectric 370. Conductor 372 is generally formed of one or more conductive materials, such as a conductively doped polysilicon. A dielectric 374 may then be formed over conductor 372. Dielectric 374 is generally formed of one or more dielectric materials. For example, dielectric 374 may be formed from an oxide, e.g., silicon oxide, an oxynitride, e.g., silicon oxynitride, etc.

Dielectric 374 may then be patterned for forming openings 376 (e.g., holes) through dielectric 374, conductor 372, and dielectric 370, stopping on or within pillars 360. For example, a mask (not shown), e.g., of photoresist, may be formed over dielectric 374 and patterned for exposing portions dielectric 374, conductor 372, and dielectric 370. The exposed portions of dielectric 374, conductor 372, and dielectric 370 are then removed, such as by etching, to form openings 376. Openings 376 may be aligned with pillars 360, as shown in FIG. 3E. Openings 376 may be substantially vertical and/or tapered in a direction from top to bottom.

A dielectric 378 may then be formed within openings 376 adjacent to dielectric 374, conductor 372, and dielectric 370 so as to line openings 376. Dielectric 378 is generally formed of one or more dielectric materials. For example, dielectric 378 may be formed from an oxide, e.g., silicon oxide, an oxynitride, e.g., silicon oxynitride, etc.

A semiconductor structure 379, e.g., polysilicon, may be formed within the remainder of openings 376 adjacent to dielectric 378 and over pillars 360 to substantially fill the remainder of openings 376. Semiconductor structure 379 forms semiconductor pillars $380_1$ and $380_2$ that may be respectively aligned with pillars $360_1$ and $360_2$. Semiconductor pillars $380_1$ and $380_2$ may be substantially vertical and/or tapered in a direction from top to bottom.

An opening 382 may then be formed between pillars $380_1$ and $380_2$, between pillars $360_1$ and $360_2$, and through dielectric 374, conductor 372, dielectric 370, conductors $330_1$-$330_5$, and dielectrics $320_1$-$320_4$, stopping on or within dielectric 318. A dielectric 384, such as oxide, nitride, bulk insulation, etc., may then be formed in opening 382 to substantially fill opening 382. Semiconductor structure 379 and dielectric 384 may be planarized, e.g., using CMP, so that upper surfaces thereof are substantially flush (e.g. flush) with the upper surface of dielectric 374. Dielectric 384 is generally formed of one or more dielectric materials. For example, dielectric 384 may be formed from an oxide, e.g., silicon oxide, an oxynitride, e.g., silicon oxynitride, bulk insulation, etc.

Dielectric 384 defines a select gate, such as a source select gate 385, on one side thereof and located adjacent to pillar $380_1$. Dielectric 384 defines another select gate, such as a drain select gate 386, on another side thereof and located adjacent to pillar $380_2$. In other words, dielectric 384 is interposed between source select gate 385 and drain select gate 386.

Pillar $380_1$ forms a channel region of source select gate 385. In other words, during operation of source select gate 385 a conductive channel can be formed in the semiconductor structure 379 of pillar $380_1$. The dielectric 378 adjacent to pillar $380_1$ forms a gate dielectric of source select gate 385, and the portion of conductor 372 adjacent to and intersecting dielectric 378 adjacent to pillar $380_1$ forms a control gate of source select gate 385, e.g., as portion of (e.g., coupled to) a source select line.

Pillar $380_2$ forms a channel region of drain select gate 386. In other words, during operation of drain select gate 386 a conductive channel can be formed in the semiconductor structure 379 of pillar $380_2$. The dielectric 378 adjacent to pillar $380_2$ forms a gate dielectric of drain select gate 386, and the portion of conductor 372 adjacent to and intersecting dielectric 378 adjacent to pillar $380_2$ forms a control gate of drain select gate 386, e.g., as portion of (e.g., coupled to) a drain select line.

Dielectric 384 further defines a portion of a string (e.g., a NAND string) of series-coupled memory cells memory cells 388 on either side thereof. For example, series-coupled memory cells $388_1$-$388_5$, formed adjacent to (e.g., on) pillar $360_1$, may form a first substantially vertical portion of the string, and series-coupled memory cells $388_6$-$388_{10}$, formed adjacent to (e.g., on) pillar $360_2$, may form a second substantially vertical portion of the string.

Semiconductor structure 355 (e.g. the portions corresponding to pillars $360_1$ and $360_2$ and the portion, e.g., the substantially horizontal portion, within conductor 310 connected to pillars $360_1$ and $360_2$) forms a channel region of memory cells $388_1$-$388_{10}$ and electrically couples memory cells $388_1$-$388_{10}$ in series. That is, during operation of the string of memory cells 388, a conductive channel(s) can be formed in semiconductor structure 355. The portion (e.g., the substantially horizontal portion) within conductor 310 connected to pillars $360_1$ and $360_2$ can electrically couple the first portion of the string of series-coupled memory cells 388 to the second portion of the string of series-coupled memory cells 388 upon applying an appropriate bias to conductor 310.

The semiconductor structure 379 corresponding to (e.g., forming) pillar $380_1$ electrically couples source select gate 385 in series with memory cell $388_1$ and thus with one end of the string of memory cells. For example, pillar $380_1$ may electrically couple source select gate 385 in series with an upper end of the first substantially vertical portion of the string. The semiconductor structure 379 corresponding to (e.g., forming) pillar $380_2$ electrically couples drain select gate 386 in series with memory cell $388_{10}$ and thus with the opposite end of the string of memory cells. For example, pillar $380_2$ may electrically couple drain select gate 386 in series with an upper end of the second substantially vertical portion of the string.

Each memory cell 388 includes a portion of semiconductor structure 355, as a channel region thereof, a portion of charge storage structure 350 that is adjacent to the portion of semiconductor structure 355 and that is intersected by a control gate 390, and the control gate 390, e.g., as a portion of (e.g., coupled to) an access line, such as a word line, adjacent to the portion of charge storage structure 350, as shown in FIG. 3E. For example, memory cells $388_1$ to $388_5$ may be respectively formed at the intersections of control gates $390_1$ to $390_5$ and the portion of charge storage structure 350 adjacent to pillar $360_1$, and memory cells $388_6$ to $388_{10}$ may be respectively formed at the intersections of control gates $390_6$ to $390_{10}$ and the portion of charge storage structure 350 adjacent to pillar $360_2$.

Opening 382 separates conductor $330_1$ into control gates $390_5$ and $390_6$, conductor $330_2$ into control gates $390_4$ and $390_7$, conductor $330_3$ into control gates $390_3$ and $390_8$, conductor $330_4$ into control gates $390_2$ and $390_9$, and conductor $330_5$ into control gates $390_1$ and $390_{10}$. The dielectric 384 within opening 382 electrically isolates the control gates 390, and thus the memory cells 388, adjacent to pillar $360_1$ from the control gates 390, and thus the memory cells 388, adjacent to pillar $360_2$ so that the memory cells 388 adjacent to the respective pillars $360_1$ and $360_2$ are electrically coupled by semiconductor structure 355.

Control gates $390_1$ and $390_{10}$ are formed from conductor $330_5$ and therefore have substantially the thickness (e.g., the thickness) $t_{300,c5}$ (FIG. 3B). Control gates $390_2$ and $390_9$ are formed from conductor $330_4$ and therefore have substantially the thickness (e.g., the thickness) $t_{300,c4}$<thickness $t_{300,c5}$ (FIG. 3B). Control gates $390_3$ and $390_8$ are formed from conductor $330_3$ and therefore have substantially the thickness (e.g., the thickness) $t_{300,c3}$<thickness $t_{300,c4}$ (FIG. 3B). Control gates $390_4$ and $390_7$ are formed from conductor $330_2$ and therefore have substantially the thickness (e.g., the thickness) $t_{300,c2}$<thickness $t_{300,c3}$ (FIG. 3B). Control gates $390_5$ and $390_6$ are formed from conductor $330_1$ and therefore have substantially the thickness (e.g., the thickness) $t_{300,c1}$<thickness $t_{300,c2}$ (FIG. 3B).

Opening 382 and the dielectric 384 formed therein separate each of the dielectrics $320_1$-$320_4$ into portions respectively adjacent to the first and second portions of the charge storage structure 350 that are respectively adjacent to pillars $360_1$ and $360_2$. A portion of a dielectric 320 is interposed between successively adjacent control gates 390 of successively adjacent memory cells 388, and thus the thickness of the respective dielectric 320 corresponds to the distance (space) between the successively adjacent control gates 390.

A portion of dielectric $320_4$ is interposed between successively adjacent control gates $390_1$ and $390_2$, and another portion of dielectric $320_4$ is interposed between successively adjacent control gates $390_9$ and $390_{10}$, meaning that the distance (e.g., space) between successively adjacent control gates $390_1$ and $390_2$ and between successively adjacent control gates $390_9$ and $390_{10}$ is substantially the thickness (e.g., is the thickness) $t_{300,d4}$ of dielectric $320_4$. A portion of dielectric $320_3$ is interposed between successively adjacent control gates $390_2$ and $390_3$, and another portion of dielectric $320_3$ is interposed between successively adjacent control gates $390_8$ and $390_9$, meaning that the distance (e.g., space) between successively adjacent control gates $390_2$ and $390_3$ and between successively adjacent control gates $390_8$ and $390_9$ is substantially the thickness (e.g., is the thickness) $t_{300,d3}$ of dielectric $320_3$. A portion of dielectric $320_2$ is interposed between successively adjacent control gates $390_3$ and $390_4$, and another portion of dielectric $320_2$ is interposed between successively adjacent control gates $390_7$ and $390_8$, meaning that the distance (e.g., space) between successively adjacent control gates $390_3$ and $390_4$ and between successively adjacent control gates $390_7$ and $390_8$ is substantially the thickness (e.g., is the thickness) $t_{300,d2}$ of dielectric $320_3$. A portion of dielectric $320_1$ is interposed between successively adjacent control gates $390_4$ and $390_5$, and another portion of dielectric $320_1$ is interposed between successively adjacent control gates $390_6$ and $390_7$, meaning that the distance (e.g., space) between successively adjacent control gates $390_4$ and $390_5$ and between successively adjacent control gates $390_6$ and $390_7$ is substantially the thickness (e.g., is the thickness) $t_{300,d1}$ of dielectric $320_1$.

The thicknesses of the respective dielectrics 320 increase as the distances (e.g., vertical) of the respective dielectrics 320 from (e.g., the heights of respective dielectrics 320 above) the bottom of the substantially vertical portion of the string of memory cells 388 in which the respective dielectrics 320 are located increases. This means that the distance between successively adjacent control gates 390, and thus between the successively adjacent memory cells 388 respectively corresponding to the successively adjacent control gates 390, resulting from a dielectric 320 therebetween, increases as the distance of the successively adjacent control gates 390, and thus the successively adjacent memory cells 388 respectively corresponding to the successively adjacent control gates 390, from (e.g., the height of the successively adjacent control gates 390, and thus the successively adjacent memory cells 388 respectively corresponding to the successively adjacent control gates 390 above) the bottom of the substantially vertical portion of the string of memory cells 388 increases. That is, the greater the height of a pair of successively adjacent memory cells 388 on a substantially vertical pillar 360, the greater the thickness of the dielectric 320, and thus the distance (e.g., space), between the successively adjacent memory cells 388 of that pair of successively adjacent memory cells 388.

Stated another way, the greater the height of a pair of successively adjacent memory cells 388 above the bottom of a substantially vertical pillar 360, the greater the thickness of the dielectric 320, and thus the distance (e.g., space), between the successively adjacent memory cells 388 of that pair of successively adjacent memory cells 388. For example, the greater the height of a pair of control gates 390 above the bottom of a substantially vertical pillar 360, the greater the thickness of the dielectric 320 between the successively adjacent control gates 390 of that pair of control gates 390.

In other words, the greater a height of a dielectric 320 above a bottom of a pillar 360, the greater a thickness of that dielectric 320. For example, the thickness of a dielectric 320 between the successively adjacent control gates increases as the distance of that dielectric 320 from the bottom of a pillar 360 increases. Note that for other embodiments, where the thickness dielectric 320 increases as a step function, the distance between successively adjacent control gates 390, and thus successively adjacent memory cells 388, increases as a step function of the distance of the successively adjacent control gates 390, and thus successively adjacent memory cells 388, from the bottom of a pillar 360.

For some embodiments, the difference between the thicknesses of dielectrics 320 at different heights may be substantially the same as or directly proportional to the difference between the inner radii of those dielectrics 320, e.g., at the centers of those dielectrics 320. For example, the difference between the thicknesses of dielectrics $320_1$ and $320_3$ may be substantially equal or directly proportional to $r_3$-$r_1$, where $r_3$ is the inner radius of dielectric $320_3$ at the center of dielectric $320_3$ and $r_1$ is the inner radius of dielectric $320_1$ at the center of dielectric $320_1$, as shown in FIG. 3.

The thickness of a control gate 390, and thus the word line corresponding thereto, of a memory cell 388 increases as the distance of that memory cell 388 from (e.g., height of that memory cell 388 above) the bottom of the substantially vertical portion of the string of memory cells 388 containing that memory cell 388 increases. That is, the greater the height of a memory cell 388, and thus the control gate 390 of that memory cell 388, on a substantially vertical pillar 360, the greater the thickness of the control gate 390 of that memory cell 388. Stated another way, the greater the height of a memory cell 388, and thus the control gate 390 of that memory cell 388, above the bottom of a substantially vertical pillar 360, the greater the thickness of the control gate 390 of that memory cell 388.

For some embodiments, the difference between the thicknesses of control gates 390 at different heights may be substantially the same as or directly proportional to the difference between the inner radii of those control gates 390, e.g., at the centers of those control gates 390. For example, the difference between the thicknesses of control gates $390_6$ and $390_9$ may be substantially equal or directly proportional to $r_9$-$r_6$, where $r_9$ is the inner radius of control gate $390_9$ at the center of control gate $390_9$ and $r_6$ is the inner radius of control gate $390_6$ at the center of control gate $390_6$, as shown in FIG. 3E.

Both the increase in thicknesses of dielectrics 320 and increase in thicknesses of control gates 390 with increasing height above the bottom of a string of memory cells 388 and the bottom of the pillar 360 on which the string of memory cells 388 is formed causes an increase in the control gate, and thus the word line, pitch $P_{300}$ with increasing height above the bottom of the string of memory cells 388 and the bottom of a pillar 360. The control gate, and thus the word line, pitch P may be defined as the center-to-center distance between successively adjacent control gates (e.g., word lines). In the example of FIG. 3E, the control gate pitch $P_{300,4}$ between control gates $390_1$ and $390_2$ and between control gates $390_{10}$ and $390_9$ is greater than the control gate pitch $P_{300,3}$ between control gates $390_2$ and $390_3$ and between control gates $390_9$ and $390_8$; the control gate pitch $P_{300,3}$ is greater than the control gate pitch $P_{300,2}$ between control gates $390_3$ and $390_4$ and between control gates $390_8$ and $390_7$; and the control gate pitch $P_{300,2}$ is greater than the control gate pitch $P_{300,1}$ between control gates $390_4$ and $390_5$ and between control gates $390_7$ and $390_6$, as shown in FIG. 3.

The increase in the control gate pitch with the height above the bottom of a pillar 360, due to the increase in the distance between successively adjacent control gates 390 of successively adjacent memory cells 388 and the increase in thickness of the control gates 390 with height above the bottom of a pillar, may act to compensate for the reduction in the programming speed of memory cells and the increase in cell-to-cell interference with increasing height above the bottom of the pillar, owing to the increasing radii of the pillars and charge-storage structures with increasing height above the bottom of the pillar.

For some embodiments, a source line 391 may be formed, from one or more conductive materials, over the dielectric 374 over source select gate 385, the upper ends of the dielectric 378 adjacent pillar $380_1$, and the upper surface of pillar $380_1$, and thus over source select gate 385. For example, source line 391 may be in electrical, e.g., and direct physical contact, with the upper surface of pillar $380_1$. Therefore, source line 391 is electrically coupled to source select gate 385 via pillar $380_1$, and is thus selectively electrically coupled to an end of the string of memory cells 388 by source select gate 385. For example, source select gate 385 may selectively electrically couple source line 391 to the upper end of the first substantially vertical portion of the string adjacent to pillar $360_1$. That is, source select gate 385 may selectively electrically couple source line 391 to memory cell $388_1$, located at the upper end of the first substantially vertical portion of the string adjacent to pillar $360_1$.

A dielectric 392 may be formed over the dielectrics 374 respectively over source select gate 385 and drain select gate 386, the upper ends of the dielectrics 378 respectively adjacent to pillar $380_2$, the upper surface of pillar $380_2$, and source line 391, and thus over source select gate 385 and drain select gate 386. Dielectric 392 is generally formed of one or more dielectric materials. For example, dielectric 392 may be formed from an oxide, e.g., silicon oxide, an oxynitride, e.g., silicon oxynitride, etc.

A contact 393 may then be formed, from one or more conductive materials, through dielectric 392 so as to electrically, e.g., and physically, contact pillar $380_2$. A data line, such as a bit line 394, may then be formed, from one or more conductive materials, such as metal (e.g., aluminum, copper, etc.), over dielectric 392 and contact 393 so as to electrically, e.g., and physically, contact the contact 393. Contact 393 electrically couples bit line 394 to pillar $380_2$, which in turn electrically couples contact 393, and thus bit line 394, to drain select gate 386.

Drain select gate 386 selectively electrically couples bit line 394 to the opposite end of the string of memory cells 388. For example, drain select gate 386 may selectively electrically couple bit line 394 to the upper end of the second substantially vertical portion of the string adjacent to pillar $360_2$. That is, drain select gate 386 may selectively electrically couple bit line 394 to memory cell $388_{10}$ located at the upper end of the second substantially vertical portion of the string adjacent to pillar $360_2$.

Figure 4:
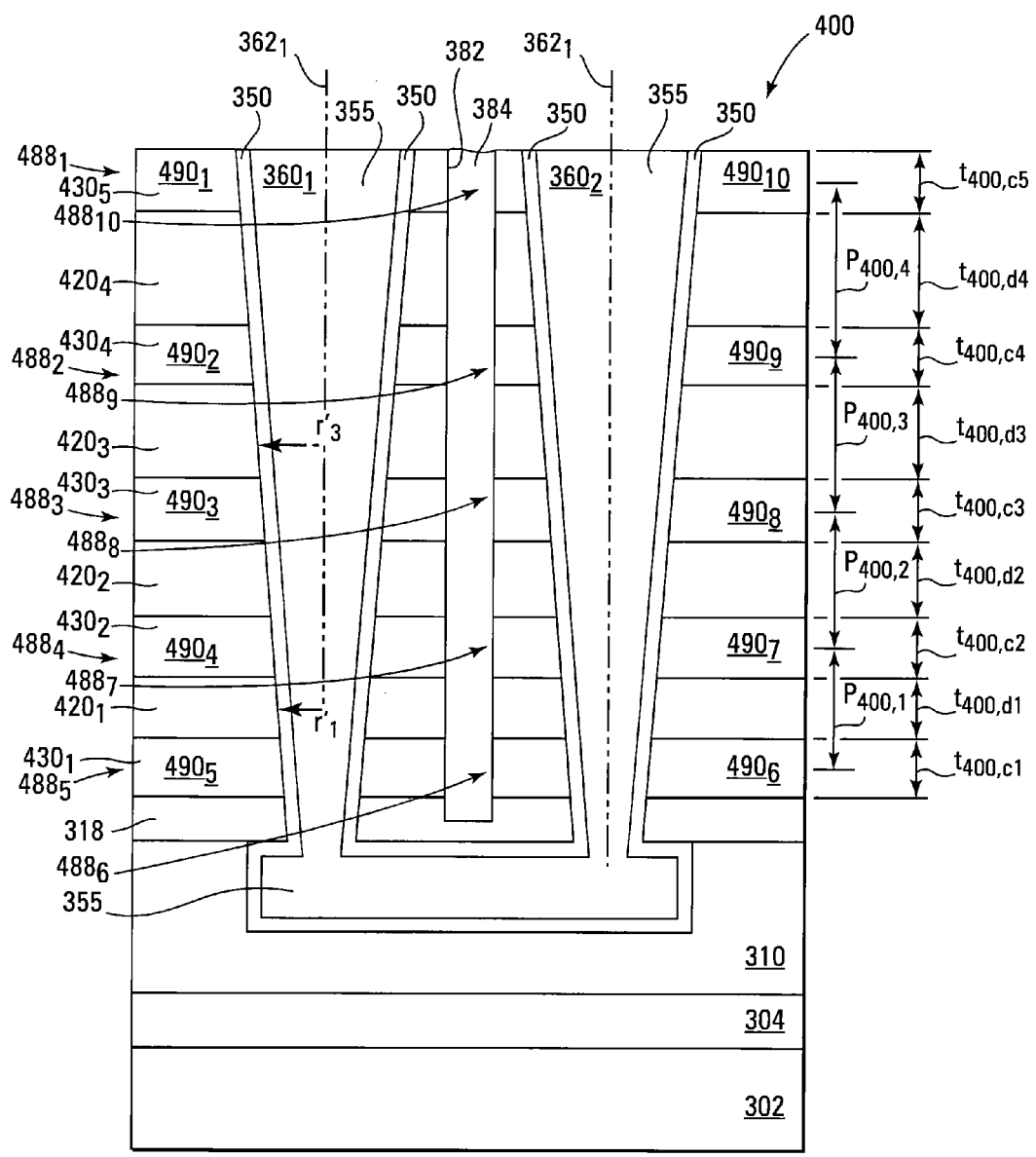
FIG. 4 is a cross-sectional view of a portion of a memory array, according to another embodiment.

FIG. 4 is a cross-sectional view of a portion of a memory array 400, e.g., as a portion of memory array 204 of FIG. 2. Common numbering is used in FIG. 4 and FIGS. 3A-3E to denote similar (e.g., the same) components. The structure of FIG. 4 corresponds to the portion of the structure of FIG. 3E located under dielectric 370 and thus focuses on a string of memory cells 488. The structure of FIG. 3E over pillars 360, including a select gate, such as select gate 385, a drain select gate, such as drain gate 386, a source line, such as source line 391, a data line, such as bit line 394, semiconductor pillars, such as pillars 380, and a dielectric, such as dielectric 378, adjacent the pillars, may be formed over the structure of FIG. 4, e.g., as described above in conjunction with FIG. 3E.

The structure of FIG. 4 is formed substantially as described above in conjunction with FIGS. 3A-3E, with alternating dielectrics 420 and conductors 430 being formed over dielectric 318 instead of alternating dielectrics 320 and conductors 330 in FIG. 3B. Dielectrics 420 and conductors 430 may respectively follow the same material guidelines as dielectrics 320 and conductors 330.

Instead of the thicknesses of the respective conductors 430 increasing as the height of the respective conductors 430 above dielectric 318 increases, as do the thicknesses of the respective conductors 330 in FIG. 3B, the thicknesses of the respective conductors 430 have substantially the same thickness (e.g., the same thickness). That is, the thicknesses of the respective conductors 430 are substantially independent (e.g., independent) of their height above dielectric 318.

The thicknesses of the respective dielectrics 420 increase as the distances of the respective dielectrics 420 from (e.g., height of the respective dielectrics 420 above) the upper surface of dielectric 318 increases. That is, the greater the height of an individual dielectric 420 above the upper surface of dielectric 318 the greater the thickness of that individual dielectric 420, as shown in FIG. 4.

The thicknesses $t_{400,c1}$-$t_{400,c5}$ respectively of conductors $430_1$-$430_5$ are substantially the same (e.g., the same). The thickness $t_{400,d4}$ of dielectric $420_4$ is greater than thickness $t_{400,d3}$ of dielectric $420_3$. The thickness $t_{400,d3}$ of dielectric $420_3$ is greater than thickness $t_{400,d2}$ of dielectric $420_2$. The thickness $t_{400,d2}$ of dielectric $420_2$ is greater than thickness $t_{400,d1}$ of dielectric $420_1$. The thickness of dielectric 318 may greater than, less than, or equal to thickness $t_{400,d1}$ of dielectric $420_1$.

Dielectric 384 defines a portion of a string (e.g., a NAND string) of series-coupled memory cells memory cells 488 on either side thereof. For example, series-coupled memory cells $488_1$-$488_5$, formed adjacent to (e.g., on) pillar $360_1$, may form a first portion of the string, and series-coupled memory cells $488_6$-$488_{10}$, formed adjacent to (e.g., on) pillar $360_2$, may form a second portion of the string.

Semiconductor structure 355 (e.g. the portions corresponding to pillars $360_1$ and $360_2$ and the portion, e.g., the substantially horizontal portion, within conductor 310 connected to pillars $360_1$ and $360_2$) forms a channel region of memory cells $488_1$-$488_{10}$ and electrically couples memory cells $488_1$-$488_{10}$ in series. That is, during operation of the string of memory cells 488 a conductive channel(s) can be formed in semiconductor structure 355. The portion (e.g., the substantially horizontal portion) within conductor 310 connected to pillars $360_1$ and $360_2$ electrically couples the first portion of the string of series-coupled memory cells 488 to the second portion of the string of series-coupled memory cells 488 upon applying an appropriate bias to conductor 310.

Each memory cell 488 includes a portion of semiconductor structure 355, as a channel region thereof, a portion of charge storage structure 350 that is adjacent to the portion of semiconductor structure 355 and that is intersected by a control gate 490, and the control gate 490, e.g., as a portion of (e.g., coupled to) an access line, such as a word line, adjacent to the portion of charge storage structure 350, as shown in FIG. 4. For example, memory cells $488_1$ to $488_5$ may be respectively formed at the intersections of control gates $490_1$ to $490_5$ and the portion of charge storage structure 350 adjacent to pillar $360_1$, and memory cells $488_6$ to $488_{10}$ may be respectively formed at the intersections of control gates $490_6$ to $490_{10}$ and the portion of charge storage structure 350 adjacent to pillar $360_2$.

Opening 382 separates conductor $430_1$ into control gates $490_5$ and $490_6$, conductor $430_2$ into control gates $490_4$ and $490_7$, conductor $430_3$ into control gates $490_3$ and $490_8$, conductor $430_4$ into control gates $490_2$ and $490_9$, and conductor $430_5$ into control gates $490_1$ and $490_{10}$. The dielectric 384 within opening 382 electrically isolates the control gates 490, and thus the memory cells 488, adjacent to pillar $360_1$ from the control gates 490, and thus the memory cells 488, adjacent to pillar $460_2$ so that the memory cells 488 adjacent to the respective pillars $360_1$ and $360_2$ are electrically coupled by semiconductor structure 355.

Control gates $490_1$ and $490_{10}$ are formed from conductor $430_5$ and therefore have substantially the thickness (e.g., the thickness) $t_{400,c5}$. Control gates $490_2$ and $490_9$ are formed from conductor $430_4$ and therefore have substantially the thickness (e.g., the thickness) $t_{400,c4}$. Control gates $490_3$ and $490_8$ are formed from conductor $430_3$ and therefore have substantially the thickness (e.g., the thickness) $t_{400,c3}$. Control gates $490_4$ and $490_7$ are formed from conductor $430_2$ and therefore have substantially the thickness (e.g., the thickness) $t_{100,c2}$. Control gates $490_5$ and $490_6$ are formed from conductor $430_5$ and therefore have substantially the thickness (e.g., the thickness) $t_{400,c1}$.

Since the thicknesses $t_{400,c1}$-$t_{400,c5}$ respectively of conductors $430_1$-$430_5$ are substantially the same (e.g., the same), the thicknesses of the control gates 490 are substantially the same (e.g., the same). This means that the control gate thicknesses are substantially independent (e.g., independent) of the distances of the corresponding memory cells from the bottom of the pillars 360 adjacent to which the respective memory cells are formed.

Opening 382 and the dielectric 384 formed therein separate each of the dielectrics $420_1$-$420_4$ into portions respectively adjacent to first and second portions of the charge storage structure 350 that are respectively adjacent to pillars $360_1$ and $360_2$. A portion of a dielectric 420 is interposed between successively adjacent control gates 490 of successively adjacent memory cells 488, and thus the thickness of the respective dielectric 420 corresponds to the distance (space) between the successively adjacent control gates 490.

A portion of dielectric $420_4$ is interposed between successively adjacent control gates $490_1$ and $490_2$, and another portion of dielectric $420_4$ is interposed between successively adjacent control gates $490_9$ and $490_{10}$, meaning that the distance (e.g., space) between successively adjacent control gates $490_1$ and $490_2$ and between successively adjacent control gates $490_9$ and $490_{10}$ is substantially the thickness (e.g., is the thickness) thickness $t_{400,d4}$ of dielectric $420_4$. A portion of dielectric $420_3$ is interposed between successively adjacent control gates $490_2$ and $490_3$, and another portion of dielectric $420_4$ is interposed between successively adjacent control gates $490_8$ and $490_9$, meaning that the distance (e.g., spacing) between successively adjacent control gates $490_2$ and $490_3$ and between successively adjacent control gates $490_8$ and $490_9$ is substantially the thickness (e.g., is the thickness) thickness $t_{400,d3}$ of dielectric $420_3$. A portion of dielectric $420_2$ is interposed between successively adjacent control gates $490_3$ and $490_4$, and another portion of dielectric $420_2$ is interposed between successively adjacent control gates $490_7$ and $490_8$, meaning that the distance (e.g., spacing) between successively adjacent control gates $490_3$ and $490_4$ and between successively adjacent control gates $490_7$ and $490_8$ is substantially the thickness (e.g., is the thickness) thickness $t_{400,d2}$ of dielectric $420_2$. A portion of dielectric $420_1$ is interposed between successively adjacent control gates $490_4$ and $490_5$, and another portion of dielectric $420_2$ is interposed between successively adjacent control gates $490_6$ and $490_7$, meaning that the distance (e.g., spacing) between successively adjacent control gates $490_4$ and $490_5$ and between successively adjacent control gates $490_6$ and $490_7$ is substantially the thickness (e.g., is the thickness) thickness $t_{400,d1}$ of dielectric $420_1$.

The thicknesses of the respective dielectrics 420 increase as the distances (e.g., vertical distances) of the respective dielectrics 420 from (e.g., the heights of respective dielectrics 420 above) the bottom of the substantially vertical portion of the string of memory cells 488 in which the respective dielectrics are located 420 increases. This means that the distance between successively adjacent control gates 490, and thus between successively adjacent memory cells 488 respectively corresponding to the successively adjacent control gates 490, resulting from a dielectric 420 therebetween, increases as the distance of the successively adjacent control gates 490, and thus of the successively adjacent memory cells 488 respectively corresponding to the successively adjacent control gates 490, from (e.g., the height of the successively adjacent control gates 490, and thus of the successively adjacent memory cells 488 respectively corresponding to the successively adjacent control gates 490, above) the bottom of the substantially vertical portion of the string of memory cells 488 increases. That is, the greater the height of a pair of successively adjacent memory cells 488 on a substantially vertical pillar 360, the greater the thickness of the dielectric 420, and thus the distance (e.g., spacing), between the successively adjacent memory cells 488 of that pair of successively adjacent memory cells 488.

Stated another way, the greater the height of a pair of successively adjacent memory cells 488 above the bottom of a substantially vertical pillar 360, the greater the thickness of the dielectric 420, and thus the distance (e.g., spacing), between the successively adjacent memory cells 488 of that pair. For example, the greater the height of a pair of control gates 490 above the bottom of a substantially vertical pillar 360, the greater the thickness of the dielectric 420 between the successively adjacent control gates 490 of that pair of control gates 490.

In other words, the greater a height of a dielectric 420 above a bottom of a pillar 360, the greater a thickness of that dielectric 420. For example, the thickness of a dielectric 420 between the successively adjacent control gates increases as the distance of that dielectric 420 from the bottom of a pillar 360 increases.

For some embodiments, the difference between the thicknesses of dielectrics 420 at different heights may be substantially the same as or directly proportional to the difference between the inner radii of those dielectrics 420, e.g., at the centers of those dielectrics 420. For example, the difference between the thicknesses of dielectrics $420_1$ and $420_3$ may be substantially equal or directly proportional to $r'_3$-$r'_1$, where $r'_3$ is the inner radius of dielectric $420_3$ at the center of dielectric $420_3$ and $r'_1$ is the inner radius of dielectric $420_1$ at the center of dielectric $420_1$, as shown in FIG. 4.

The increase in thicknesses of dielectrics 420 with increasing height above the bottom of a string of memory cells 488 and the bottom of a pillar 360 on which the string of memory cells 488 is formed causes an increase in the control gate, and thus the word line, pitch $P_{400}$ with increasing height above the bottom of the string of memory cells 488 and the bottom of the pillar 360. In the example of FIG. 4, the control gate pitch $P_{400,4}$ between control gates $490_1$ and $490_2$ and between control gates $490_{10}$ and $490_9$ is greater than the control gate pitch $P_{400,3}$ between control gates $490_2$ and $490_3$ and between control gates $490_9$ and $490_8$; the control gate pitch $P_{400,3}$ is greater than the control gate pitch $P_{400,2}$ between control gates $490_3$ and $490_4$ and between control gates $490_8$ and $490_7$; and the control gate pitch $P_{400,2}$ is greater than the control gate pitch $P_{400,1}$ between control gates $490_4$ and $490_5$ and between control gates $490_7$ and $490_6$, as shown in FIG. 4.

Allowing the thickness of a dielectric 420, and thus the distance, between successively adjacent control gates 490 of successively adjacent memory cells 488 to increase with the height of the dielectric 420, and thus the height of the successively adjacent memory cells 488, from the bottom of a string of memory cells 488 and from the bottom of a pillar 360, may act to compensate for the differences (e.g., reduce the differences) in the programming properties of memory cells with increasing height above the bottom of a pillar, such as the decrease in programming speed with the height of the memory cell above the bottom of the pillar, owing to the increasing radii of the pillars and charge-storage structures with increasing height above the bottom of the pillar. This may also compensate (e.g., reduce) the cell-to-cell interference associated with increasing height above the bottom of a pillar, owing to the increasing radii of the pillars and charge-storage structures with increasing height above the bottom of a pillar. In other words, the increase in the control gate pitch with the height above the bottom of a pillar 360, due to the increase in the distance between successively adjacent control gates 490 of successively adjacent memory cells 488 with height above the bottom of the pillar, may act to compensate for the reduction in the programming speed of memory cells and the increase in cell-to-cell interference with increasing height above the bottom of a pillar, owing to the increasing radii of the pillars and charge storage structures with increasing height above the bottom of the pillar.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming a memory array, comprising:
   forming a plurality of control gates;
   forming a charge-storage structure adjacent to the plurality of control gates; and
   forming a substantially vertical semiconductor structure adjacent to the charge-storage structure;
   wherein each memory cell of a portion of a series-coupled string of memory cells comprises a respective one of the control gates and a portion of the charge-storage structure; and
   wherein a thickness of a dielectric between the control gates of adjacent ones of the memory cells at one end of the portion of the series-coupled string of memory cells is greater than a thickness of a dielectric between the control gates of adjacent other ones of the memory cells at an opposing end of the portion of the series-coupled string of memory cells.

2. The method of claim 1, wherein a thickness of a dielectric between the control gates of successively adjacent memory cells of the portion of the series-coupled string of memory cells increases as a step function of a distance of the dielectric from the opposing end.

3. The method of claim 1, wherein a thickness of a dielectric between the control gates of successively adjacent memory cells of the portion of the series-coupled string of memory cells increases as a distance of the successively adjacent control gates from the opposing end of the portion of the series-coupled string of memory cells increases.

4. The method of claim 3, wherein forming a plurality of control gates comprises forming a plurality of control gates having respective increasing thicknesses of the respective control gates as the distances of the respective control gates from the opposing end of the portion of the series-coupled string of memory cells increase.

5. The method of claim 1, wherein the plurality of control gates are a plurality of first control gates, wherein the charge-storage structure adjacent to the plurality of control gates is a first portion of a charge storage structure, wherein the substantially vertical semiconductor structure is a substantially vertical first semiconductor structure, and wherein the portion of the series-coupled string of memory cells is a first portion of the series-coupled string of memory cells, and further comprising:
   forming a plurality of second control gates;
   forming a second portion of the charge-storage structure adjacent to the plurality of second control gates; and
   forming a substantially vertical second semiconductor structure adjacent to the second portion of the charge-storage structure;
   wherein each memory cell of a second portion of the series-coupled string of memory cells comprises a respective one of the second control gates and a portion of the second portion of the charge storage structure; and
   wherein a thickness of a dielectric between the second control gates of adjacent ones of the memory cells at one end of the second portion of the series-coupled string of memory cells is greater than a thickness of a dielectric between the second control gates of adjacent other ones of the memory cells at an opposing end of the second portion of the series-coupled string of memory cells.

6. The method of claim 5, wherein forming the plurality of first control gates and forming the plurality of second control gates occur substantially concurrently, forming the first portion of the charge-storage structure and forming the second portion of the charge-storage structure occur substantially concurrently, and forming the substantially vertical first semiconductor structure and forming the substantially vertical second semiconductor structure occur substantially concurrently.

7. The method of claim 5, wherein a thickness of a dielectric between the second control gates of successively adjacent memory cells of the second portion of the series-coupled string of memory cells increases as a distance of the successively adjacent second control gates from the opposing end of the second portion of the series-coupled string of memory cells increases.

8. The method of claim 7, wherein forming a plurality of second control gates comprises forming a plurality of second control gates having respective increasing thicknesses as the distances of the respective second control gates from the opposing end of the second portion of the series-coupled string of memory cells increase.

9. The method of claim 5, further comprising forming the first and second substantially vertical semiconductor structures to be connected to each other.

10. The method of claim 5, further comprising forming the first and second portions of the charge storage structure to be connected together.

11. The method of claim 1, wherein a difference between the thickness of the dielectric between the control gates of the adjacent ones of the memory cells at the one end of the portion of the series-coupled string of memory cells and the thickness of the dielectric between the control gates of the adjacent other ones of the memory cells at the opposing end of the portion of the series-coupled string of memory cells is substantially the same as or is directly proportional to a difference between inner radii of those dielectrics.

12. A method of forming a memory array, comprising:
forming a plurality of control gates;
forming a plurality of dielectrics, wherein the control gates and the dielectrics alternate so that a respective one of the plurality of dielectrics is interposed between successively adjacent ones of the plurality of control gates;
forming a charge storage structure adjacent to the plurality of control gates and the plurality of dielectrics; and
forming a substantially vertical pillar adjacent to the charge storage structure;
wherein each memory cell of a portion of a series-coupled string of memory cells comprises a respective one of the control gates and a portion of the charge storage structure; and
wherein a thickness of a respective one of the plurality of dielectrics interposed between successively adjacent ones of the plurality of control gates at one end of the pillar is greater than a thickness of another respective one of the plurality of dielectrics interposed between successively adjacent other ones of the control gates at an opposing end of the pillar.

13. The method of claim 12, wherein a greater a height of a respective one of the dielectrics above the opposing end of the pillar, a greater a thickness of that dielectric.

14. The method of claim 13, further comprising forming the plurality of control gates such that a greater a height of a respective one of the control gates above the opposing end of the pillar, a greater a thickness of that control gate.

15. A method of forming a memory array, comprising:
forming a first conductor over a semiconductor, wherein the first conductor comprises a first sacrificial material;
forming a first dielectric over the first conductor and the first sacrificial material;
forming a plurality of second conductors and a plurality of second dielectrics over the first dielectric, wherein the second conductors of the plurality of second conductors and the second dielectrics of the plurality of second dielectrics alternate so that a respective one of the plurality of second dielectrics is interposed between successively adjacent ones of the plurality of second conductors;
forming first and second substantially vertical openings through the plurality of second conductors, the plurality of second dielectrics, and the first dielectric, stopping on or within the first sacrificial material;
removing the first sacrificial material from the first conductor to form a third opening;
forming a charge-storage structure within the first, second, and third openings, the charge-storage structure having substantially vertical first and second portions; and
forming a semiconductor structure within a remaining portion of the third opening adjacent to the charge-storage structure, the semiconductor structure having substantially vertical first and second portions respectively adjacent to the substantially vertical first and second portions of the charge-storage structure;
wherein each memory cell of a first portion of a string of series-coupled memory cells is formed at an intersection of a respective one of the plurality of second conductors and the substantially vertical first portion of the charge-storage structure;
wherein each memory cell of a second portion of the string of series-coupled memory cells is formed at an intersection of a respective one of the plurality of second conductors and the substantially vertical second portion of the charge-storage structure; and
wherein a thickness of a respective one of the plurality of second dielectrics at one end of the first portion of the string of series-coupled memory cells is greater than a thickness of another respective one of the plurality of second dielectrics at an opposing end of the first portion of the string of series-coupled memory cells.

16. The method of claim 15, further comprising before removing the first sacrificial material from the first conductor, forming a second sacrificial material within the first and second openings, and wherein forming the third opening further comprises removing the second sacrificial material from the first and second openings.

17. The method of claim 15, wherein a thickness of a respective one of the plurality of second dielectrics at one end of the second portion of the string of series-coupled memory cells is greater than a thickness of another respective one of the plurality of second dielectrics at an opposing end of the second portion of the string of series-coupled memory cells.

18. The method of claim 15, wherein a greater a height of a respective one of the plurality of second dielectrics above the first dielectric, a greater a thickness of that second dielectric.

19. The method of claim 18, further comprising forming the plurality of second conductors such that a greater a height of a respective one of the plurality of second conductors above the first dielectric, a greater a thickness of that second conductor.

20. The method of claim 15, further comprising forming the substantially vertical first and second portions of the charge-storage structure and the substantially vertical first and second portions of the semiconductor structure to be tapered in a direction toward the first conductor.

21. The method of claim 15, wherein forming the charge-storage structure within the third opening further comprises forming a third portion within the first conductor connected to the substantially vertical first and second portions of the charge-storage structure, and wherein forming the semiconductor structure within the remaining portion of the third opening and adjacent to the charge-storage structure further comprises forming a third portion within the first conductor adjacent to the third portion of the charge-storage structure, the third portion of the semiconductor structure being connected to the substantially vertical first and second portions of the semiconductor structure.

* * * * *